US012598692B2

(12) United States Patent
Subrahmanyam et al.

(10) Patent No.: US 12,598,692 B2
(45) Date of Patent: Apr. 7, 2026

(54) LOCKING TENSIONER COOLING ASSEMBLY FOR PLUGGABLE ELECTRONIC COMPONENT

(71) Applicant: Intel Corporation, Santa Clara, CA (US)

(72) Inventors: Prabhakar Subrahmanyam, San Jose, CA (US); Mark E. Sprenger, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 875 days.

(21) Appl. No.: 17/697,909

(22) Filed: Mar. 17, 2022

(65) Prior Publication Data

US 2022/0210906 A1 Jun. 30, 2022

(51) Int. Cl.
*H05K 1/02* (2006.01)
*H05K 7/20* (2006.01)

(52) U.S. Cl.
CPC ......... *H05K 1/0203* (2013.01); *H05K 7/2049* (2013.01); *H05K 2201/10159* (2013.01)

(58) Field of Classification Search
CPC ....... H05K 1/0201–0212; H05K 1/181; H05K 7/10; H05K 7/1402; H05K 7/20254; H05K 7/20418; H05K 7/20436; H05K 7/2049; H05K 7/205; H05K 7/20509; H01L 23/3672; H01L 23/3677; H01L 23/4093; H01L 23/427; H01L 23/473; H01L 2023/4068; G06F 1/16; G06F 1/184–185; G06F 1/20; G06F 2200/201
See application file for complete search history.

(56) References Cited

U.S. PATENT DOCUMENTS

| | | | | |
|---|---|---|---|---|
| 8,154,873 B2 * | 4/2012 | Lian | .......................... | G06F 1/20 |
| | | | | 361/720 |
| 10,296,059 B2 * | 5/2019 | Cox | ................... | H05K 7/20509 |
| 11,011,449 B1 * | 5/2021 | Qu | ....................... | H01L 23/3672 |
| 2004/0250989 A1 * | 12/2004 | Im | ....................... | H01L 23/4093 |
| | | | | 165/80.1 |
| 2006/0221573 A1 * | 10/2006 | Li | .......................... | G11C 5/143 |
| | | | | 257/E23.101 |
| 2007/0070607 A1 * | 3/2007 | Goodwin | .............. | H01L 23/367 |
| | | | | 257/E23.102 |
| 2009/0034183 A1 * | 2/2009 | Chen | ................... | H01L 23/4093 |
| | | | | 361/679.47 |
| 2009/0129026 A1 * | 5/2009 | Baek | ................... | H01L 23/4275 |
| | | | | 361/710 |
| 2009/0257197 A1 * | 10/2009 | Yang | ................... | H01L 23/4093 |
| | | | | 361/720 |
| 2010/0025010 A1 * | 2/2010 | Cipolla | ............... | H01L 23/4093 |
| | | | | 165/47 |
| 2011/0286179 A1 * | 11/2011 | Motschman | ........ | H01L 23/4093 |
| | | | | 361/679.54 |

(Continued)

*Primary Examiner* — Amir A Jalali
(74) *Attorney, Agent, or Firm* — Compass IP Law PC

(57) ABSTRACT

An apparatus is described. The apparatus includes a cooling assembly. The cooling assembly includes a cooling mass; a first heat spreader; a second heat spreader; a spring element; and, hinge components to form a hinge that the first and second heat spreaders rotate about. The spring element to apply a force to the first and second heat spreaders that causes the first and second heat spreaders to rotate about the hinge toward a circuit board located between the first and second heat spreaders.

18 Claims, 15 Drawing Sheets

(56) References Cited

U.S. PATENT DOCUMENTS

| | | | |
|---|---|---|---|
| 2017/0052573 A1* | 2/2017 | Cox | H01L 21/4882 |
| 2021/0259091 A1* | 8/2021 | Zirretta | H05K 1/0203 |
| 2022/0003511 A1* | 1/2022 | Embleton | B32B 3/30 |
| 2022/0225542 A1* | 7/2022 | Subrahmanyam | H05K 1/0203 |

* cited by examiner

206b

206a

214

213

215

LOCKING TENSIONER COOLING ASSEMBLY FOR PLUGGABLE ELECTRONIC COMPONENT

BACKGROUND

With the emergence of "big data" and high performance, centralized computing (e.g., "cloud computing"), processor and memory chips are being pushed to higher and higher levels of performance. The increased performance translates into increased processor and memory chip heat dissipation.

Heat dissipation with respect to dynamic random access memory (DRAM) dual in-line memory modules (DIMMs) is particularly troublesome because of the small spacing between DIMMs. For example, older technology DDR4 DIMMs tend to consume 24 Watts (W) maximum and are commonly spaced 0.8 mm apart, whereas, leading edge DDR5 DIMMs can consume as much as 36 W and can be placed as little as 0.3 mm apart.

The combination of higher DIMM heat dissipation and smaller air gaps between DIMMs brings DIMM cooling into the forefront of challenges faced by systems designers.

FIGURES

FIG. 1 shows an improved cooling assembly;

FIGS. 2a, 2b, 2c, 2d, 2e, 2f, 2g, 2h and 2i pertain to an embodiment of the improved cooling assembly of FIG. 1;

DETAILED DESCRIPTION

Figure 1:
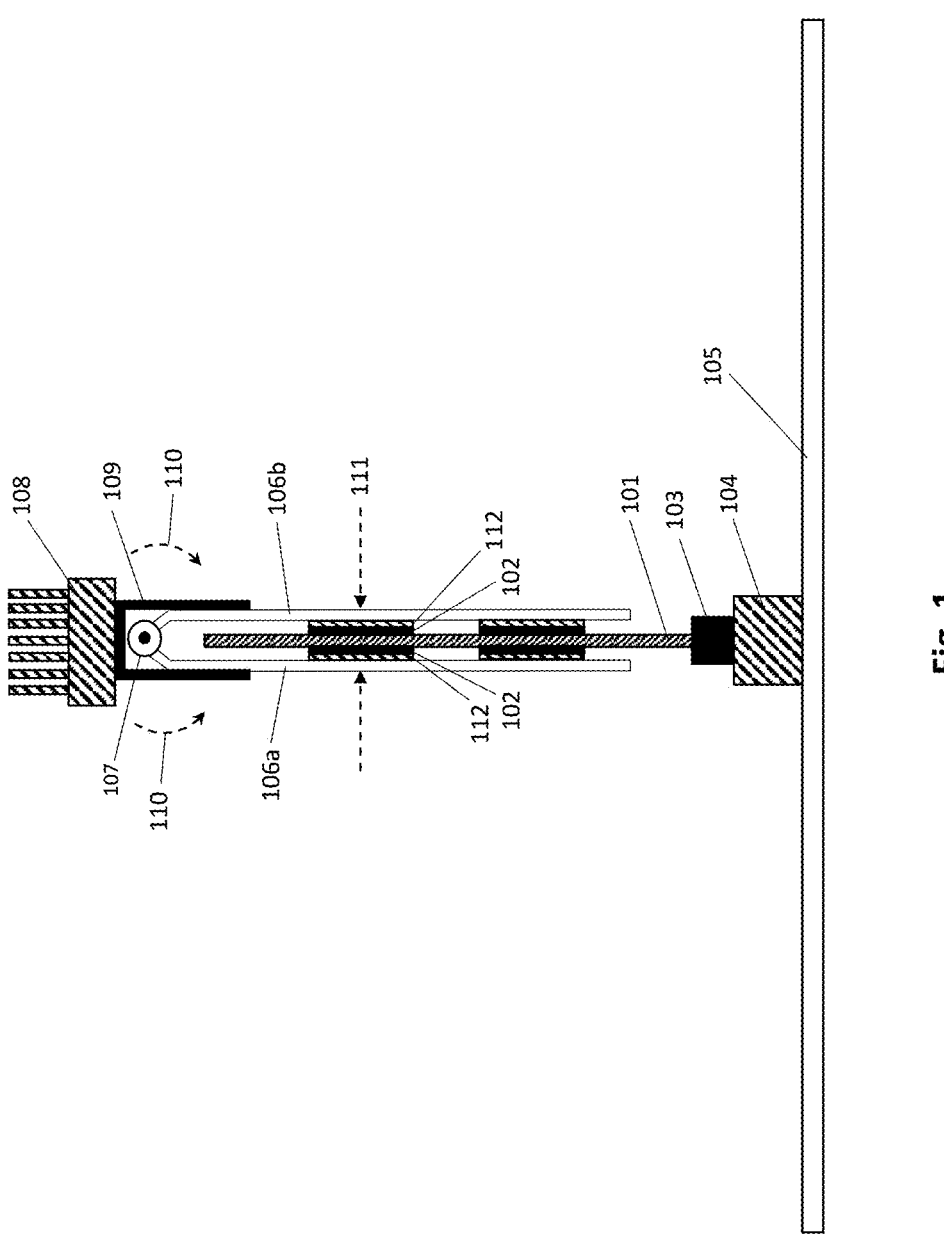

FIG. 1 shows a cooling assembly that is designed to dissipate large amounts of heat (e.g., 36 W or more) from a DIMM having minimal spacing between neighboring DIMMs (e.g., 0.3 mm). As observed in FIG. 1, the IMM includes a printed circuit board 101 with semiconductor chip packages 102 disposed on both sides of the DIMM. The underside of the DIMM has a connector 103 so that the DIMM can plug into a corresponding connector 104 on a motherboard or other kind of (e.g., system) printed circuit board 105.

The cooling assembly includes respective heat spreaders 106a, 106b on both sides of the DIMM. The heat spreaders are hinged together by a hinge 107. A spring element 109 applies a spring loading force that causes the heat spreaders 106a, 106b to rotate 110 about the hinge and press into the DIMM's semiconductor chip packages 102 (thermal interface material (TIM) 112 is disposed between the chip packages 102 and the heat spreaders 106a,b).

A heat sink 108 is thermally coupled to the heat spreaders 106a,b. In operation, heat that is generated by the semiconductor chips within the semiconductor chip packages 102 is transferred to the heat spreaders 106a,b, which, in turn, is transferred to the heat sink 108 and then heat sink's ambient thereby removing heat from the system.

Notably, in the cooling assembly's nominal state, the spring element 109 is deformed (e.g., is stretched) from its own nominal state, which, in turn, causes the heat spreaders 106a, 106b to forcibly rotate 110 toward the DIMM's printed circuit board 101 and apply pressure 111 upon the semiconductor chip packages 102 that are disposed on the sides of the DIMM's printed circuit board 101. The pressing 111 of the heat spreaders 106a,b into the chip packages 102 improves the transferability of heat from the chip packages 102 to the heat spreaders 106a,b (the thermal resistance between the two is lowered).

Additionally, the heat spreaders 106 a,b are designed to rotate about the hinge 107 and "clamp" the IMM between the heat spreaders 106 a,b. The clamping of the DEV IM between the heat spreaders 106 a,b presses the heat spreaders 106 a,b against the semiconductor chip packages 102 on both sides of the DIMM thereby enhancing the thermal transfer from the chip packages 102 to the heat spreaders 106 a,b, which, in turn, enhances the cooling efficiency of the overall cooling assembly. As described in more detail below, in various embodiments, a wedge element is inserted between the heat spreaders 106 a,b to force the above described rotation and lock the heat spreaders 106 a,b in a clamping state.

In various embodiments, the heat sink 108 is supported by support elements (not shown in FIG. 1) that channel the weight of the heat sink 108 into the heat spreaders 106a, 106b a radial distance from the hinge 107 so as to further induce rotation 110 of the heat spreaders 106a,b about the hinge 107 toward the DIMM's printed circuit board 101.

In various embodiments, the hinge components, wedge element and/or support element components are extensions from the heat spreaders 106a,b themselves. For example, some of the hinge components and/or some of the support elements are mechanical features that extend from a particular one of the heat spreaders 106a,b (e.g., by forming a heat spreader having such hinge and/or support features in a common mold). In other embodiments, at least some of the hinge components, wedge element, support elements, and heat spreaders are separately manufactured and then assembled together to form the overall cooling assembly.

In various embodiments, as observed in FIG. 1, the spring element 109 is effected with one or more "U" shaped clips or similar structures (hereinafter referred to as "U clips") that straddle both heat spreaders 106a,b. The distance between legs of any particular U clip is less than the combined thickness of both heat spreaders 106a,b with the DIMM between them. As such, when the U clip is placed over the heat spreaders 106a,b, the U clip's legs bend outward thereby creating the aforementioned pressing force 111.

That is, being bent outward, the clip's legs desire to return to their unbent form and exert a compressive force 111 on the heat spreaders 106a,b that rotates the heat spreaders 106a,b toward the DIMM's printed circuit board 101.

In alternate or combined embodiments, conceivably, the compressive force 111 could be applied with one or more springs each having one end attached to one heat spreader and the other end attached to the other heat spreader. The attachment to both heat spreaders 106a,b stretches the spring beyond its nominal length. The spring, desiring to return to its nominal shorter, length, exerts a compressive force 111 on both heat spreaders 106a,b that squeezes the DIMM between them.

Figure 2A:
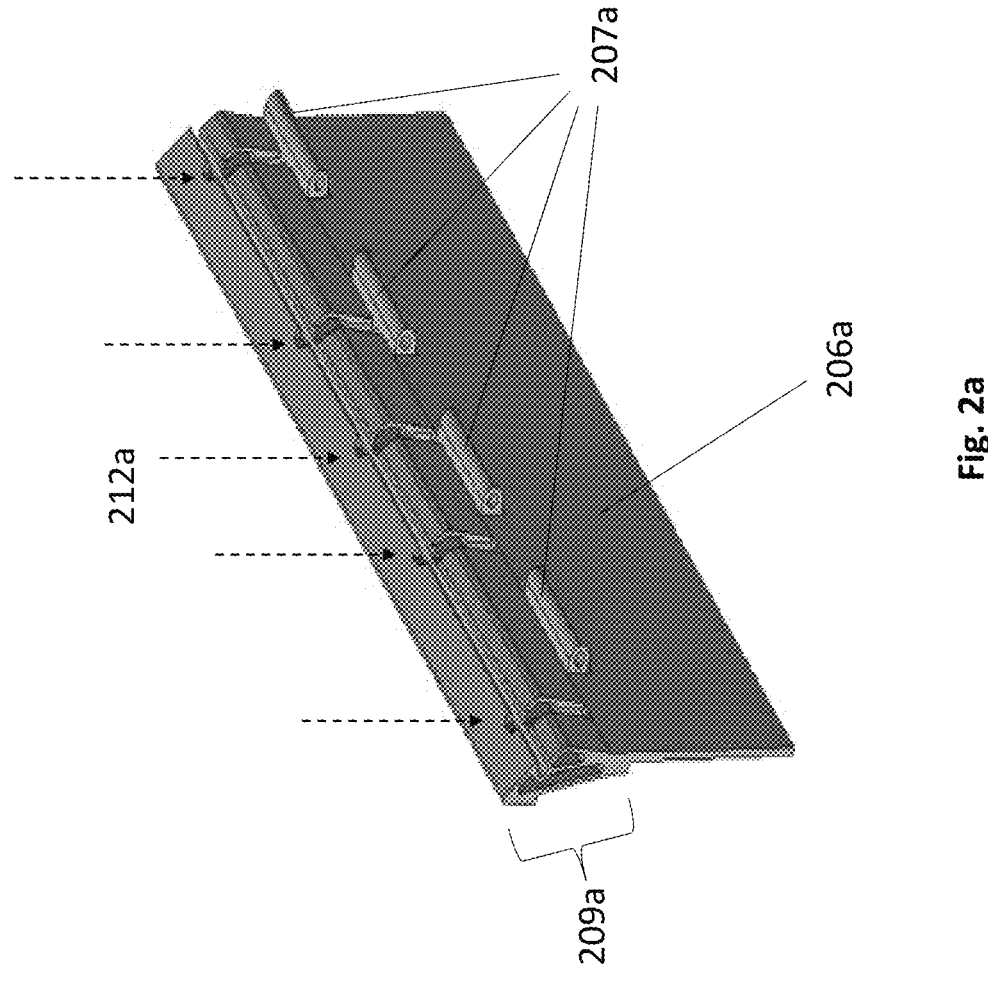

FIGS. 2a through 2f show the assembly process for one embodiment of the cooling assembly described just above. FIG. 2a shows a three dimensional view of a "left" heat spreader 206a. As observed in FIG. 2a, the heat spreader 206a includes hinge elements 207a that are dispersed along the length of the heat spreader 206a near the top of the heat spreader 206a. The heat spreader also includes support elements 209a that support the heat sink and, as described more fully below, cause the heat spreader 206*a* to rotate into the DIMM when under the weight of the heat sink 208.

The heat spreader 206*a* also includes a series of vertical holes 212*a* that are dispersed along the length of the heat spreader near the top of the heat spreader 206*a* (as described in more detail further below each of these holes receive one end of a respective U clip). The heat spreader 206*a* also includes a heat sink mounting element, implemented as a rail (not visible in the perspective of FIG. 2*a*), that runs along the length of the heat spreader 206*a* near the top of the heat spreader 206*a* (as described in more detail below, the base of a heat sink will be placed and slid upon the rail to mount the heat sink upon the heat spreader 206*a*).

Figure 2B:
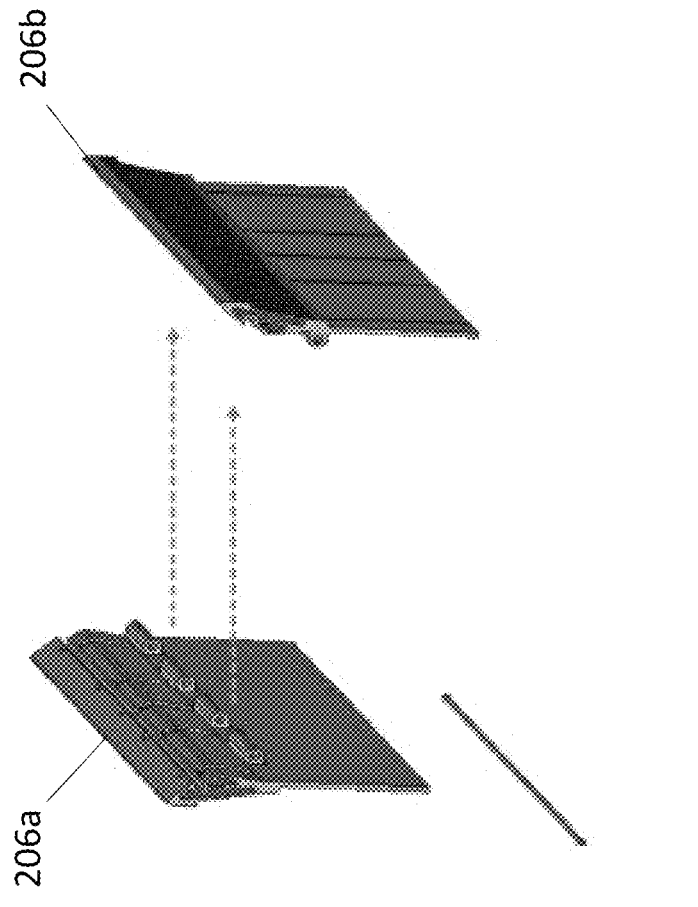

FIG. 2*b* shows the left heat spreader 206*a* of FIG. 2*a* being mated with a second, "right" heat spreader 206*b*. The mating of the heat spreaders 206*a*, 206*b* interleaves their respective hinge elements such that a hole is formed that runs along the length of the heat spreaders through the hinge elements. More specifically, referring briefly to FIGS. 2*a* and 2*b*, the hinge elements of the right heat spreader 206*b* are designed to fit into the spaces between the hinge elements 207*a* of the left heat spreader 206*a* (the interleaving) to form the rotational elements of a hinge. In various embodiments the hinge elements 207*a* are inexpensively formed by curling or extruding tab extensions into cylindrical form.

Figure 2C:
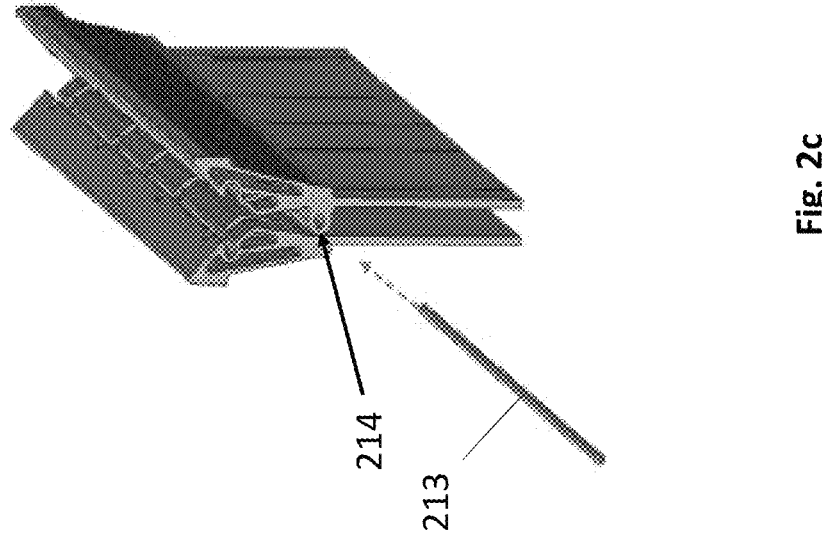

FIG. 2*c* shows a hinge pin 213 being inserted into a length wise hole 214 that is formed by the interleaved hinge elements. The insertion of the hinge pin 213 completes the formation of the hinge. The hinge pin 213 can be secured in the hole 214, e.g., by having a head with diameter that is larger than the hole on one end a cotter pin (or other pin) that is inserted into a hole that runs through the diameter of the hinge pin to block the hinge pin from being pulled out of the interleaved hinge elements.

Figure 2D:
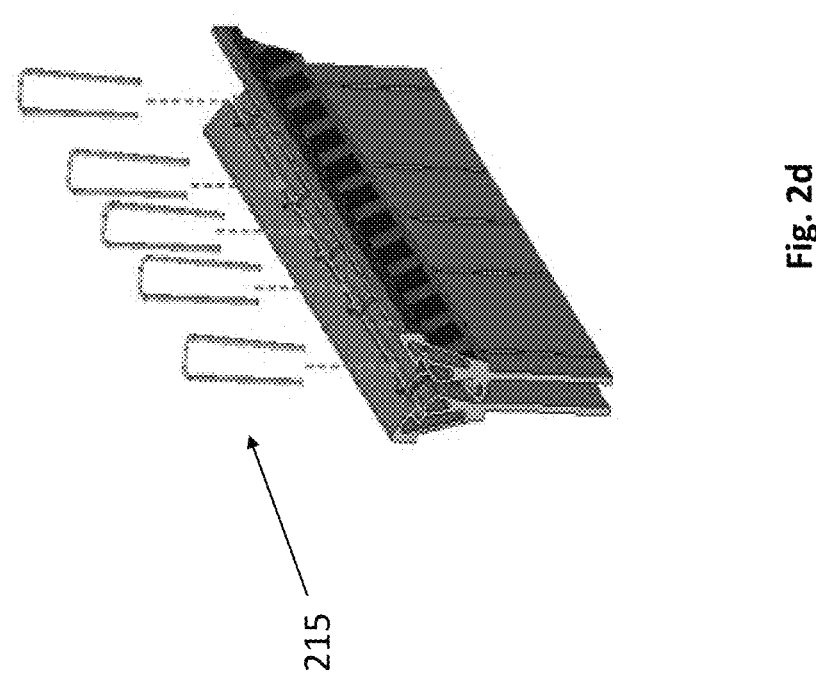

FIG. 2*d* shows U clips 215 being inserted into the corresponding holes on the top of the heat spreaders 206*a*,*b*. The U clips 215, as described above, are spring elements that will impart spring loading forces on the heat spreaders 206*a*,*b* to rotate them towards the DIMM.

Figure 2E:
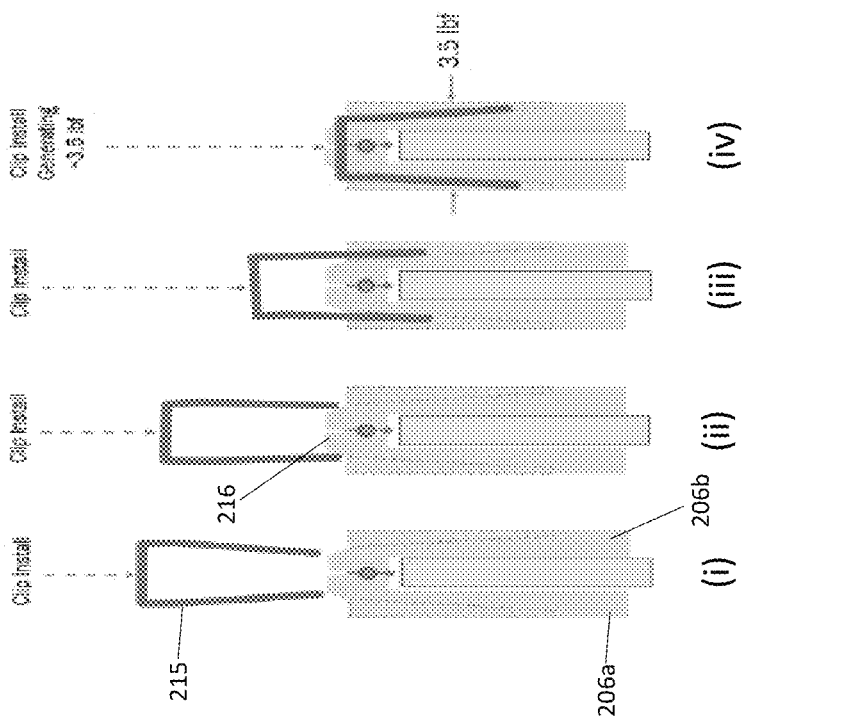

FIG. 2*e* shows a side view sequence of the insertion of a U clip 215. Notably, the holes in the heat spreaders 206*a*,*b* that the U clips are inserted into force the legs of the U clip to taper outward away from the DIMM. Also, to increase the loading force applied by the U clips when they are fully inserted into their respective holes, the U clip 215 is formed such that its legs bend inward as observed at inset (i) which depicts the U clip 215 as it approaches its corresponding holes in the heat spreaders 206*a*,*b*.

Notably, as observed in inset (ii), the top of the heat spreaders 206*a*,*b* includes a feature 216 to drive the bent in ends of the U clip 215 outward so that they can properly enter their corresponding holes in the heat spreaders 206*a*,*b*. Notably, the more feature 216 bends the U clip outward, the more compressive force the U clip will exert into the DIMM. As such, the design of feature 216 and the design of the corresponding U clip can determine how many U clips are appropriate for any particular design/application.

Inset (iii) shows the U clip 215 as it is being pressed into the holes in the heat spreaders 206*a*,*b*. Inset (iv) shows the U clip 215 after it has been fully inserted into the holes in the heat spreaders 206*a*,*b*. Comparing the shape of the U clip 215 after it has been fully inserted into the heat spreaders 206*a*,*b* (inset (iv)) against its nominal shape (inset (i)), the legs of the U clip 215, when fully inserted into the heat spreaders 206*a*,*b*, are bent substantially outward from their nominal shape.

The legs of the U clip will naturally try to return to their nominal shape, which, in turn, creates a compressive force that drives both heat spreaders into the DIMM. As described above, this compressive force helps create a low thermal resistance between the heat spreaders 206*a*,*b* and the semiconductor chip packages on the DIMM. As such, the heat spreaders 206*a*,*b* should receive a large amount of the heat generated by the semiconductor chips within the DIMM's semiconductor chip packages.

In general, the greater the mass of the heat spreaders 206*a*,*b*, the greater the spring load force per U clip, and/or, the greater the number of U clips per heat spreader. According to one embodiment, at least 10 lbs of pressure should be applied against the heat spreaders (5 lbs of pressure per heat spreader) to firmly press the heat spreaders against the DIMM. In this case, the heat spreaders should be designed to receive four or five U clips that each apply a force of 2.5 lbs against the heat spreader (1.25 lbs per side) when installed. The combined pressure exerted upon the heat spreaders by a full set of four or five U clips meets the 10 lbs minimum criteria (e.g., 4 clips×2.5 lbs/clip=10 lbs, 5 clips×2.5 lbs/clip=12.5 lbs). The particular embodiment of FIG. 2*e* suggests a force of 3.5 lbs per clip.

FIG. 2*e* suggests that the U clips are inserted into their respective holes in the heat spreaders while the DIMM 217 is located between the heat spreaders 206*a*,*b*. In other embodiments, the technician can clamp the heat spreaders 206*a*,*b* onto the DIMM akin to a clamshell because the hinge has already been formed. That is, the technician can apply force to rotate the heat spreaders about the hinge outward to fit them over the DIMM. Once the heat spreaders have been placed upon their respective sides of the DIMM, the U clips are inserted to clamp the heat spreaders 206*a*,*b* to the DIMM.

Figure 2F:
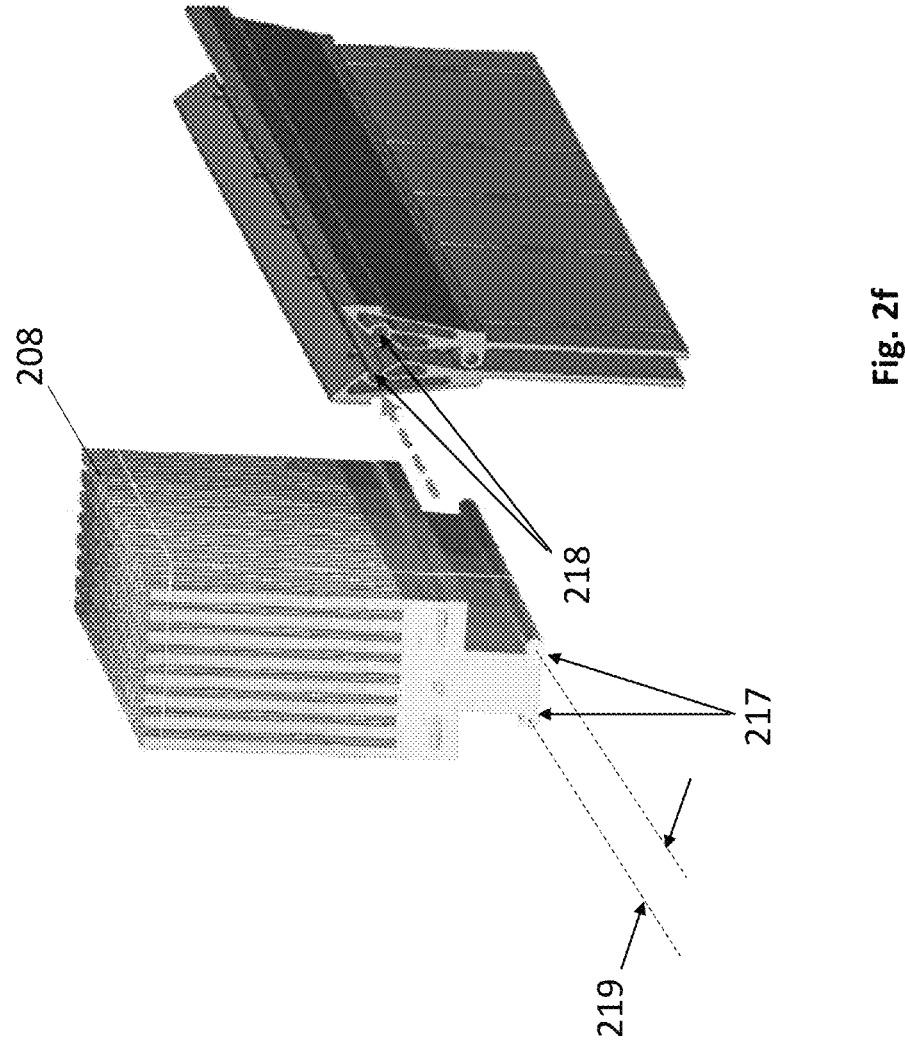

After the U clips have been installed, referring to FIG. 2*f*, the heat sink 208 is mounted on the heat spreaders 206*a*,*b*. Here, the base of the heat sink has runner structures 217 that are designed to fit into and slide along corresponding rails 218 that are formed in the heat spreaders 206*a*,*b* (described more fully further below). Thus, to mount the heat sink 208 to the heat spreaders 206*a*,*b*, the runners 217 on the heat sink 208 are aligned with and inserted into the heat spreaders' rails 218.

Figure 2G:
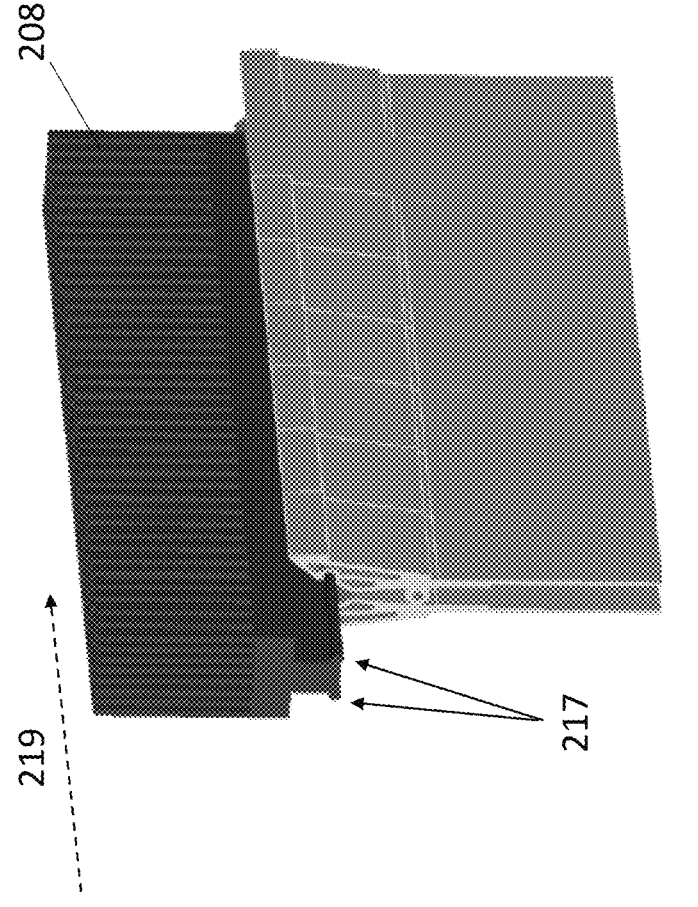

The heat sink's runners 217 are then slid 219 along the rails 218 to fully mount the heat sink 208 as observed in FIG. 2*g*. In various embodiments, the runners 217 are designed to be a distance 219 apart from one another such that, when they are mounted within their respective rails 216, the runners 217 effectively "push" the rails 216 away from one another. The pushing of the rails 216 away from one another causes the heat spreaders 106*a*,*b* to rotate about the hinge and "clamp" the semiconductor chip packages on both sides of the DIMM in a locked manner. The locked clamping of the heat spreaders 106*a*,*b* against the DIMM's semiconductor chip packages obviates any relaxation or wear-out of the U clips and/or TIM material over time.

Here, the runners 217 and the segment of the heat sink base between them to effect the appropriate runner spacing 219 form an effective "wedge element" that, when inserted between the heat spreaders, causes sufficient rotation of the heat spreaders 106*a*,*b* to clamp the DIMM in a locked fashion as described just above (locking tensioner).

In the particular embodiment of FIG. 2*g*, the wedge element (runners 217 and heat sink segment between them) is formed entirely with the heat sink. In other embodiments the wedge element can be a separate, mechanical element that is not part of the heat sink or the heat spreaders (e.g., it is a separate piece of the cooling assembly). In still other embodiments the wedge element is at least partially formed by one or both of the heat spreaders 106a,b (e.g., one of the heat spreaders includes an upper arm that keeps the other heat spreader away by the appropriate distance to effect DIMM clamping). In still other embodiments the wedge element is formed by any combination of the heat sink, heat spreader(s) and/or separate cooling assembly piece. In various embodiments the interleaved hinge elements from the pair of heat spreaders are designed to lock when the heat spreaders are rotated the correct amount (the hinge elements having mechanical interlocking features).

In at least some embodiments the weight of the heat sink 208 is used to help effect the clamping of the DIMM. For example, the weight of the heat sink 208 is translated, at least in part, to a torque about the hinge. The torque under the weight of the heat sink induces rotation of the heat spreaders 106a,b against the DIMM's semiconductor chip packages thereby further improving (reducing) the thermal resistance between the semiconductor chip packages and the heat spreaders 106a,b. The torque can be created, for example, by positioning structural support element(s) for the heat sink that are integrated with a heat spreader some radial distance away from the hinge to effectively create a lever arm. The weight of the heat sink pressing against the lever arm induces rotation of the heat sink which further clamps the heat spreader to the DIMM.

Additionally, the mass of the heat sink base between the runner structures 217 acts as a ceiling that prevents the U clips from sliding upward in response to their respective legs pressing into the heat spreaders 206a,b. As such the heat sink 208 keeps the U clips under tension (they cannot relieve their stress/tension and continues to press against the heat spreaders 206a,b).

Figure 2H:
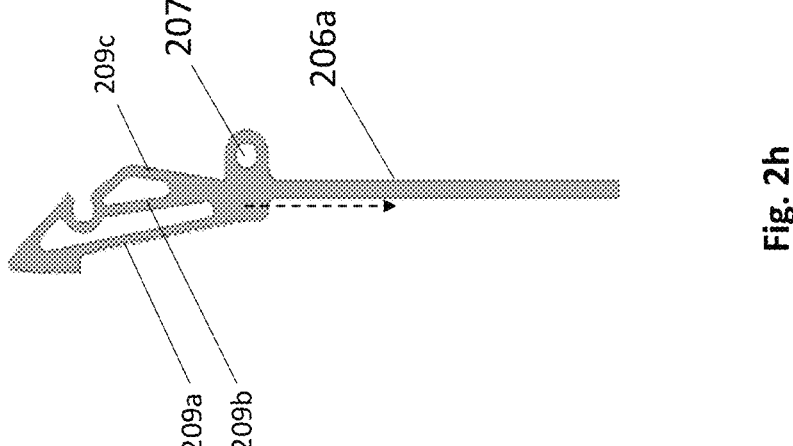

FIG. 2h shows a cross section of a heat spreader 206a. As observed in FIG. 2h, an upper region of the heat spreader, the support arm 209a includes surface area enhancement structures 209b,c. The surface area enhancement structures 209b,c introduce air gaps into the structure of the heat spreader 106a, which, in turn, increases the thermal interface between the heat spreader 206a and the ambient (the surface area enhancement structures 209b,c increase the surface area of the heat spreader 206a within the ambient).

With a larger thermal interface between the heat spreader 106a and the ambient, heat from the semiconductor chips can transfer to the ambient directly from the heat spreader 106a rather than from the heat spreader 106a to the heat sink (the heat spreader 206a itself can act as a heat sink). Surface area enhancement structures can take on various kinds of forms other than those depicted in FIG. 2h. For example, other kinds of surface area enhancement structures can include fins or posts that emanate from the heat spreader; roughened, grooved and/or pitted heat spreader surfaces, etc.

Figure 2I:
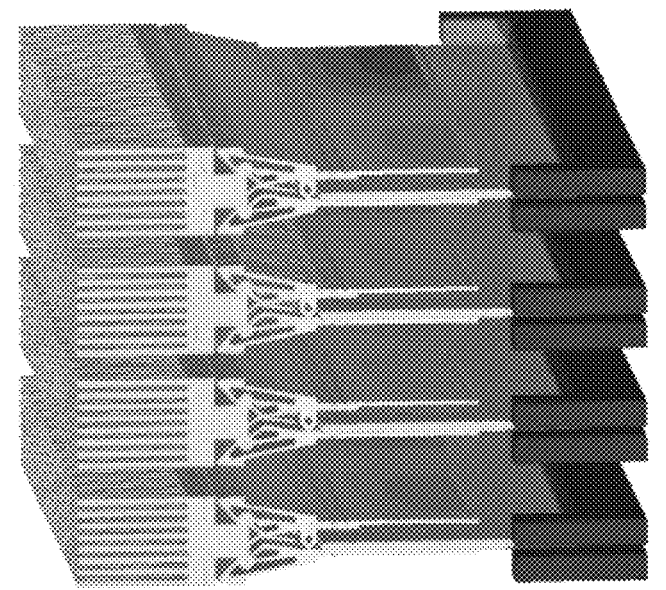

The angled design of the support arm 209a also keeps the width of the cooling assembly within narrow DIMM spacing limits in the space between DIMMs. For example, FIG. 2i shows a side view of four DIMMs each having the above described cooling assembly. As can be seen in FIG. 2i, for any particular DIMM with attached cooling assembly, the heat spreaders' support arms and heat sink maintain a narrow width profile that provides sufficient clearance/spacing between DIMMs with respective attached cooling assemblies.

Figure 3:
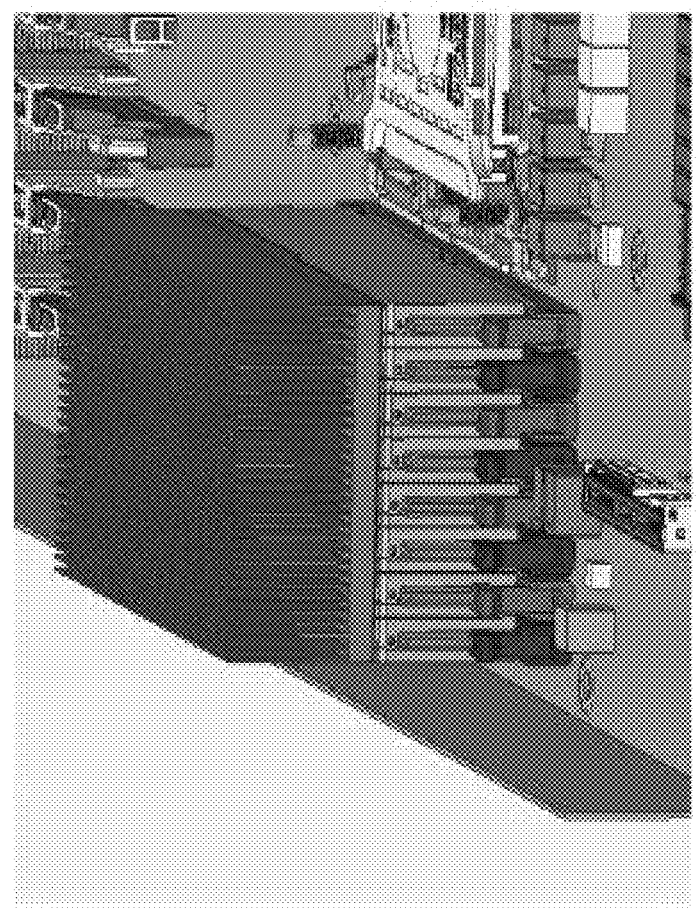
FIG. 3 show another embodiment of the improved cooling assembly of FIG. 1.

FIG. 3 demonstrates that other embodiments may choose to install a single heat sink on top of a bank of DIMMs with associated hinged heat spreaders as described above. Here, the hinged heat spreaders and U clips can be applied per DIMM as discussed above. However, once a bank of DIMMs with attached heat spreaders have been installed into their respective DIMM connector, a single heat spreader that extends across the bank of DIMMs can be installed into the heat spreaders of the DIMMs.

As mentioned above, in any/all of the embodiments described above, the thermal resistance between a DIMM's semiconductor chip packages and their corresponding heat spreaders can be lowered by incorporating a thermal interface material (TIM) between he chip packages and the heat spreaders. Here, a TIM is generally composed of a soft material (e.g., a paste) that deforms into the surfaces of the chip packages and/or heat spreaders thereby increasing the effective surface area of the thermal coupling between the chip packages and the heat spreaders.

Notably, the rotation of the heat spreaders into any TIM are described at length above allows for many different kinds of soft, solid phase TIMs (e.g., soft gap pads). Here, prior art solutions limited the use of soft, solid phase TIMs because such TIMs were damaged by the removal of the heat spreaders. By contrast, the uniform application/removal of the heat spreaders to/from the surfaces of the chip packages as a consequence of the rotation action of the heat spreaders imparts little (if any) TIM damage.

Although embodiments above have stressed the use of a heat sink which relies upon air-cooling (heat is transferred from the heat sink to the ambient as air passes through the heat sink fins), in other embodiments the aforementioned heat sink is replaced with a liquid cooled cold plate.

In the case of a liquid cooled cold plate, the cold plate is attached to the hinged heat spreaders (as per the heat sink as discussed at length above). The cold plate has a cooled fluid input port that receives cooled fluid. Heat that the cold plate receives from the heat spreaders is transferred to the fluid as the fluid runs through the cold plate. The cold plate also has a warmed fluid output port. Fluid that was warmed passing through the cold plate exits the cold plate from the warmed fluid output port thereby removing heat from the overall system.

Figure 4:
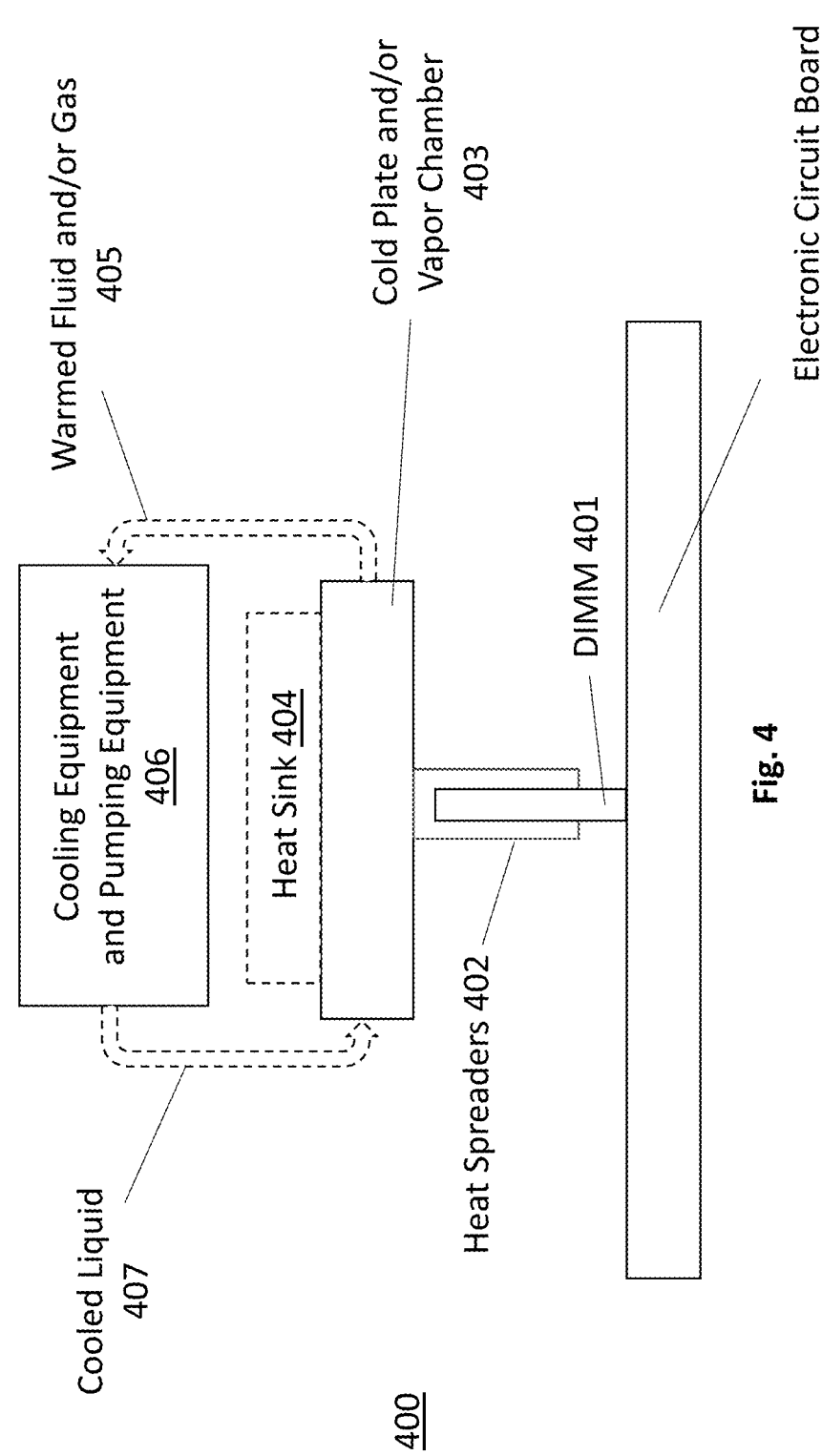
FIG. 4 shows a liquid and/or two phase cooling implementation.

FIG. 4 shows an embodiment 400 of a larger cooling system infrastructure that can support the liquid cooling of one or more DIMMs with a liquid cooled cold plate as described above. As observed in FIG. 4, heat spreaders 402 are thermally coupled to the semiconductor chip packages of a DIMM 401 as described above. A liquid cold plate 403 is thermally coupled with the heat spreaders 402.

Liquid coolant is within the liquid cold plate 403. If the system also employs air cooling (optional), a heat sink 404 can be thermally coupled to the liquid cold plate 403. Warmed liquid coolant 405 leaves the liquid cold plate 403 to be cooled by one or more items of cooling equipment (e.g., heat exchanger(s), radiator(s), condenser(s), refrigeration unit(s), etc.) and pumped by one or more items of pumping equipment (e.g., dynamic (e.g., centrifugal), positive displacement (e.g., rotary, reciprocating, etc.)) 406. Cooled liquid 407 then enters the cold plate 403 and the process repeats.

With respect to the cooling equipment and pumping equipment 406, cooling activity can precede pumping activity, pumping activity can precede cooling activity, or multiple stages of one or both of pumping and cooling can be intermixed (e.g., in order of flow: a first cooling stage, a first pumping stage, a second cooling stage, a second pumping stage, etc.) and/or other combinations of cooling activity and pumping activity can take place.

Moreover, the intake of any equipment of the cooling equipment and pumping equipment 406 can be supplied by one liquid cooled cold plate or multiple liquid cooled cold plates.

In the case of multiple liquid cold plates, the cold plates can be associated with a same electronic circuit board or different electronic circuit boards. In the case of the later (multiple electronic circuit boards), the multiple electronic circuit boards can be components of a same electronic system (e.g., different boards in a same server computer) or different electronic systems (e.g., electronic circuit boards from different server computers).

In essence, the general depiction of FIG. 4 describes compact cooling systems (e.g., a cooling system contained within a single electronic system), expansive cooling systems (e.g., cooling systems that cool the components of any of a rack, multiple racks, a data center, etc.) and cooling systems in between.

In the case of a vapor chamber, the vapor chamber has liquid that boils when large amounts of heat are transferred from the heat spreaders to the vapor chamber. The vapor then exits the vapor chamber (through a vapor exit port) and is condensed elsewhere. The condensation creates cooled liquid which is returned to the vapor chamber (through a cooled fluid input port). The larger infrastructure of FIG. 4 can therefore also be applicable to a vapor chamber solution in which a vapor chamber corresponds to box 403 instead of a liquid cooled cold plate.

Heat sinks, liquid cooling cold plates and vapor chambers are all different kinds of cooling masses. As such, the teachings above can be applied more generally to a cooling mass. Additionally, the teachings above can be applied to many different kinds of pluggable electronic modules having semiconductor chips disposed on both sides of a circuit board. As such the above teachings should not be construed to be limited to DIMMs, specifically but any kind of module that includes one or more semiconductor chips mounted to a circuit board (such as a printed circuit board) that plugs into a larger system.

For example, the teachings above can be applied to a solid state drive (SSD) form factor approach that is being promulgated by the Enterprise and Data Center Form Factor (EDSFF) Working Group. Specifically, the SSD is packaged in the shape of a "ruler" where the ruler consists of a number of semiconductor chips mounted to a circuit board and an electrical connector that is mounted at a far edge of the circuit board. The semiconductor chips are disposed along the long, run length of the ruler. The thickness of the ruler largely corresponds to the height of the chip packages and the thickness of the circuit board they are mounted to.

The form factor shape of a ruler includes a length that is at least 1.8 times its width. For example, EDSFF ruler form factors include dimensions of 38.4 mm×318.75 mm ("E1.L") or 76 mm×142.2 mm ("E3.L"). A number of Next Generation Form Factor (NGFF) solutions, also known as "M2", also offer a ruler shaped form factor (e.g., 22 m×80 mm and 22 mm×110 mm). Consistent with the concept of a ruler, a mass storage device embodied in a ruler form factor has a relatively thin height or thickness as compared to the dimensions of its width and length (e.g., thickness is less than half of the ruler's smallest width/length dimension). For example, EDSFF ruler solutions have thicknesses of only 7.5 mm and 16.8 mm while M2 ruler solutions have thicknesses of only 1.3 mm, 2.23 mm and 3.88 mm). The ruler form factor can conceivably be applied not only to mass storage pluggable electronic components but also memory pluggable electronic components (e.g., byte addressable non volatile memory).

Figure 5:
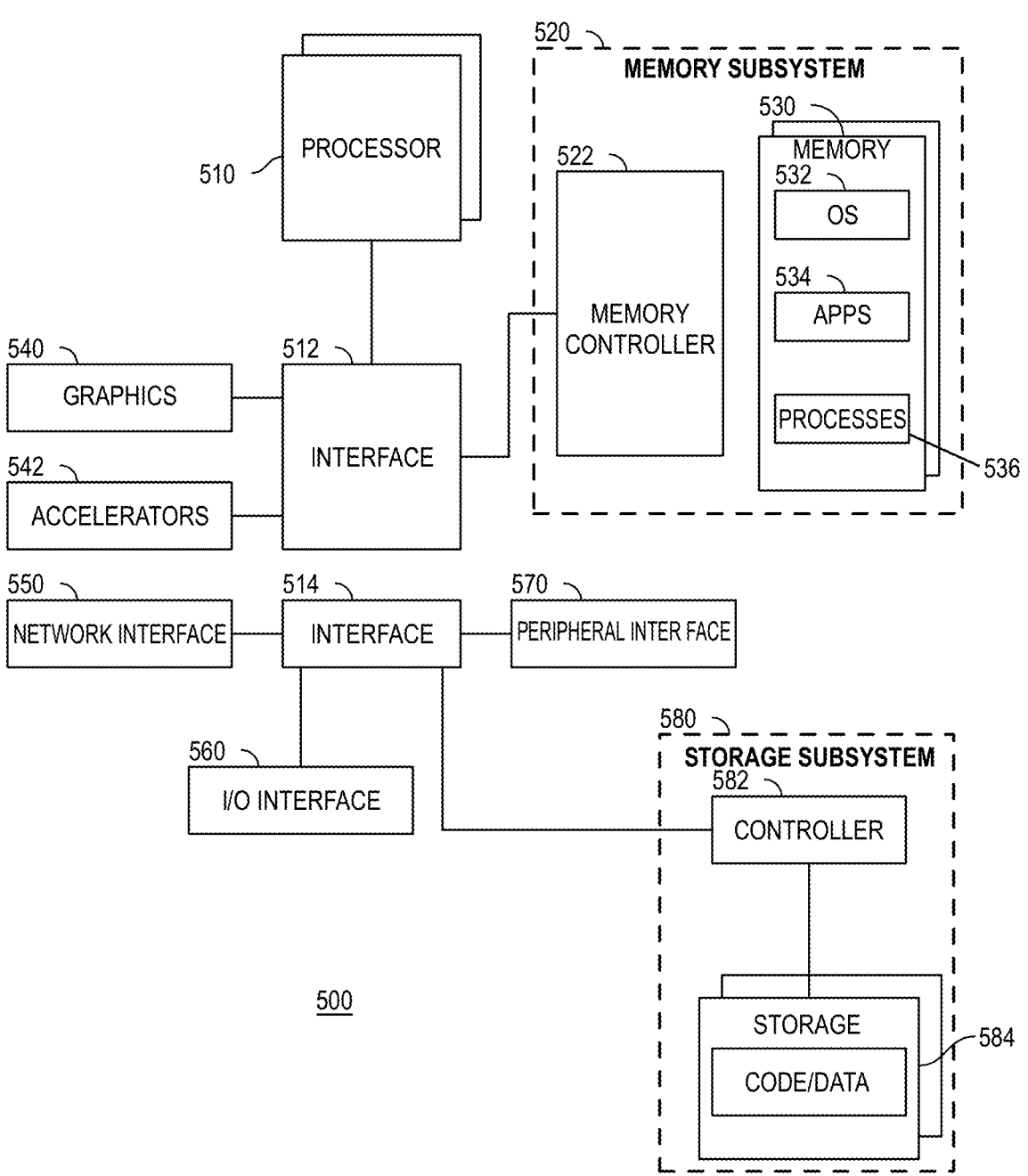
FIG. 5 shows an electronic system.
Figure 6:
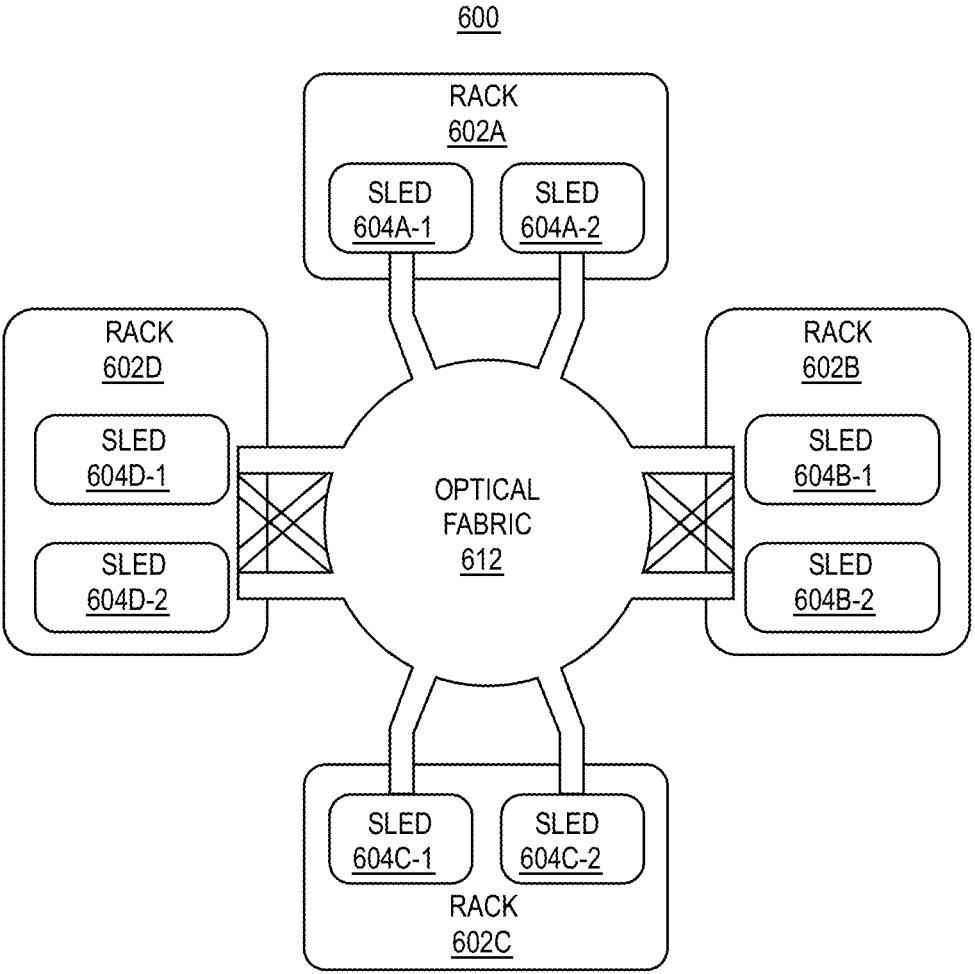
FIG. 6 shows a data center.
Figure 7:
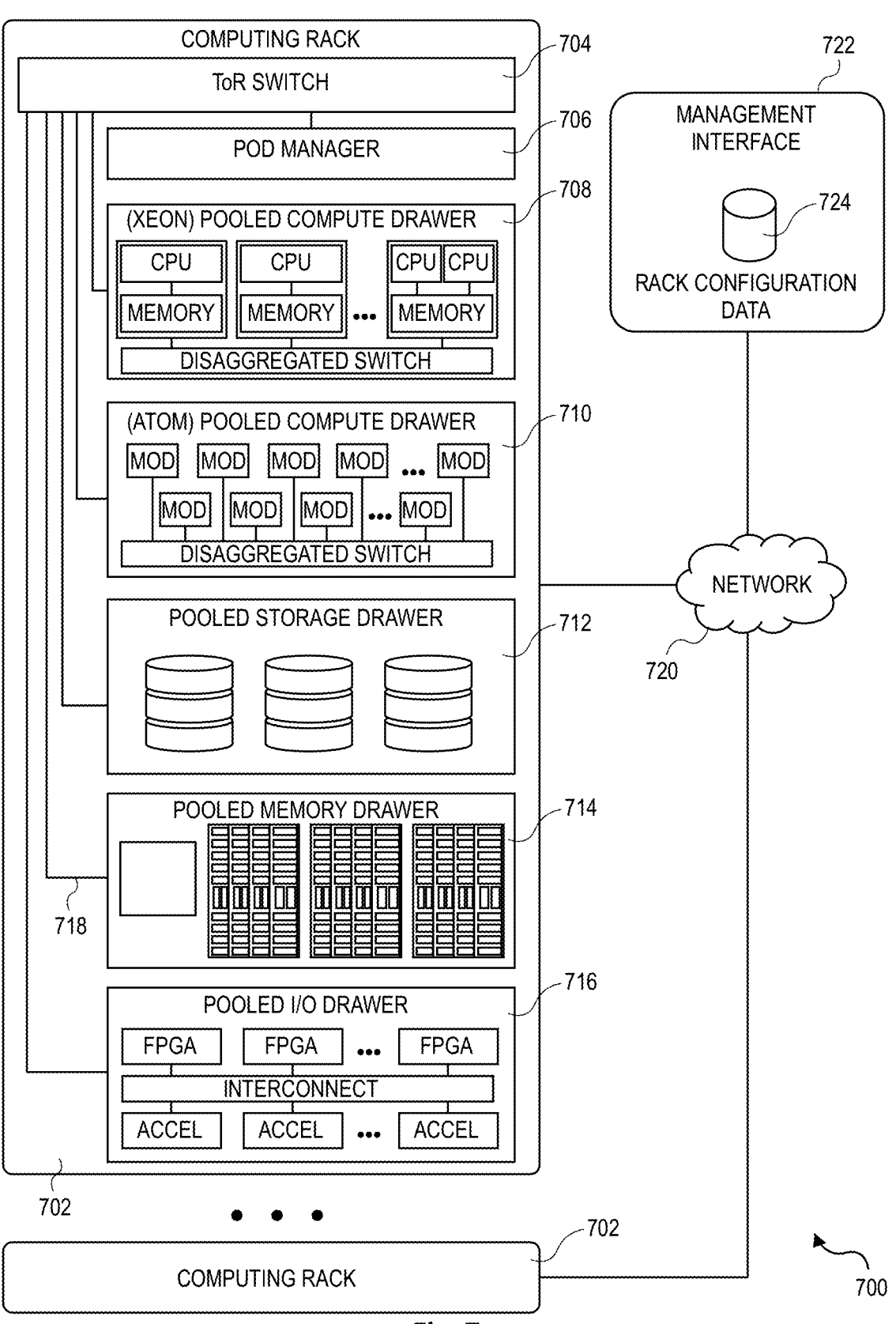
FIG. 7 shows a rack.

The following discussion concerning FIGS. 5, 6 and 7 are directed to systems, data centers and rack implementations, generally. FIG. 5 generally describes possible features of an electronic system that can include one or more semiconductor chip packages having a cooling assembly that is designed according to the teachings above. FIG. 6 describes possible features of a data center that can include such electronic systems. FIG. 7 describes possible features of a rack having one or more such electronic systems installed into it.

FIG. 5 depicts an example system. System 500 includes processor 510, which provides processing, operation management, and execution of instructions for system 500. Processor 510 can include any type of microprocessor, central processing unit (CPU), graphics processing unit (GPU), processing core, or other processing hardware to provide processing for system 500, or a combination of processors. Processor 510 controls the overall operation of system 500, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Certain systems also perform networking functions (e.g., packet header processing functions such as, to name a few, next nodal hop lookup, priority/flow lookup with corresponding queue entry, etc.), as a side function, or, as a point of emphasis (e.g., a networking switch or router). Such systems can include one or more network processors to perform such networking functions (e.g., in a pipelined fashion or otherwise).

In one example, system 500 includes interface 512 coupled to processor 510, which can represent a higher speed interface or a high throughput interface for system components that needs higher bandwidth connections, such as memory subsystem 520 or graphics interface components 540, or accelerators 542. Interface 512 represents an interface circuit, which can be a standalone component or integrated onto a processor die. Where present, graphics interface 540 interfaces to graphics components for providing a visual display to a user of system 500. In one example, graphics interface 540 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 540 generates a display based on data stored in memory 530 or based on operations executed by processor 510 or both. In one example, graphics interface 540 generates a display based on data stored in memory 530 or based on operations executed by processor 510 or both.

Accelerators 542 can be a fixed function offload engine that can be accessed or used by a processor 510. For example, an accelerator among accelerators 542 can provide compression (DC) capability, cryptography services such as public key encryption (PKE), cipher, hash/authentication capabilities, decryption, or other capabilities or services. In some embodiments, in addition or alternatively, an accelerator among accelerators 542 provides field select controller capabilities as described herein. In some cases, accelerators 542 can be integrated into a CPU socket (e.g., a connector to a motherboard or circuit board that includes a CPU and provides an electrical interface with the CPU).

For example, accelerators 542 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic circuitry, and programmable processing elements such as field programmable gate arrays (FPGAs). Accelerators 542 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

The system can also include an infrastructure processing unit (IPU) or data processing unit (DPU) to process the requests received by the system and dispatch them to an appropriate processor or accelerator within the system.

Memory subsystem 520 represents the main memory of system 500 and provides storage for code to be executed by processor 510, or data values to be used in executing a routine. Memory subsystem 520 can include one or more memory devices 530 such as read-only memory (ROM), flash memory, volatile memory, or a combination of such devices. Memory 530 stores and hosts, among other things, operating system (OS) 532 to provide a software platform for execution of instructions in system 500. Additionally, applications 534 can execute on the software platform of OS 532 from memory 530. Applications 534 represent programs that have their own operational logic to perform execution of one or more functions. Processes 536 represent agents or routines that provide auxiliary functions to OS 532 or one or more applications 534 or a combination. OS 532, applications 534, and processes 536 provide software functionality to provide functions for system 500. In one example, memory subsystem 520 includes memory controller 522, which is a memory controller to generate and issue commands to memory 530. It will be understood that memory controller 522 could be a physical part of processor 510 or a physical part of interface 512. For example, memory controller 522 can be an integrated memory controller, integrated onto a circuit with processor 510. In some examples, a system on chip (SOC or SoC) combines into one SoC package one or more of: processors, graphics, memory, memory controller, and Input/Output (I/O) control logic circuitry.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory), JESD235, originally published by JEDEC in October 2013, LPDDR5, HBM2 (HBM version 2), or others or combinations of memory technologies, and technologies based on derivatives or extensions of such specifications.

In various implementations, memory resources can be "pooled". For example, the memory resources of memory modules installed on multiple cards, blades, systems, etc. (e.g., that are inserted into one or more racks) are made available as additional main memory capacity to CPUs and/or servers that need and/or request it. In such implementations, the primary purpose of the cards/blades/systems is to provide such additional main memory capacity. The cards/blades/systems are reachable to the CPUs/servers that use the memory resources through some kind of network infrastructure such as CXL, CAPI, etc.

The memory resources can also be tiered (different access times are attributed to different regions of memory), disaggregated (memory is a separate (e.g., rack pluggable) unit that is accessible to separate (e.g., rack pluggable) CPU units), and/or remote (e.g., memory is accessible over a network).

While not specifically illustrated, it will be understood that system 500 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium, a universal serial bus (USB), or an Institute of Electrical and Electronics Engineers (IEEE) standard 1394 bus.

In one example, system 500 includes interface 514, which can be coupled to interface 512. In one example, interface 514 represents an interface circuit, which can include standalone components and integrated circuitry. In one example, multiple user interface components or peripheral components, or both, couple to interface 514. Network interface 550 provides system 500 the ability to communicate with remote devices (e.g., servers or other computing devices) over one or more networks. Network interface 550 can include an Ethernet adapter, wireless interconnection components, cellular network interconnection components, USB (universal serial bus), or other wired or wireless standards-based or proprietary interfaces. Network interface 550 can transmit data to a remote device, which can include sending data stored in memory. Network interface 550 can receive data from a remote device, which can include storing received data into memory. Various embodiments can be used in connection with network interface 550, processor 510, and memory subsystem 520.

In one example, system 500 includes one or more input/output (I/O) interface(s) 560. I/O interface 560 can include one or more interface components through which a user interacts with system 500 (e.g., audio, alphanumeric, tactile/ touch, or other interfacing). Peripheral interface 570 can include any hardware interface not specifically mentioned above. Peripherals refer generally to devices that connect dependently to system 500. A dependent connection is one where system 500 provides the software platform or hardware platform or both on which operation executes, and with which a user interacts.

In one example, system 500 includes storage subsystem 580 to store data in a nonvolatile manner. In one example, in certain system implementations, at least certain components of storage 580 can overlap with components of memory subsystem 520. Storage subsystem 580 includes storage device(s) 584, which can be or include any conventional medium for storing large amounts of data in a nonvolatile manner, such as one or more magnetic, solid state, or optical based disks, or a combination. Storage 584 holds code or instructions and data in a persistent state (e.g., the value is retained despite interruption of power to system 500). Storage 584 can be generically considered to be a "memory," although memory 530 is typically the executing or operating memory to provide instructions to processor 510. Whereas storage 584 is nonvolatile, memory 530 can include volatile memory (e.g., the value or state of the data is indeterminate if power is interrupted to system 500). In one example, storage subsystem 580 includes controller 582 to interface with storage 584. In one example controller 582 is a physical part of interface 514 or processor 510 or can include circuits in both processor 510 and interface 514.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 500. More specifically, power source typically interfaces to one or multiple power supplies in system 500 to provide power to the components of system 500. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 500 can be implemented as a disaggregated computing system. For example, the system 500 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Although a computer is largely described by the above discussion of FIG. 5, other types of systems to which the above described invention can be applied and are also partially or wholly described by FIG. 5 are communication systems such as routers, switches and base stations.

FIG. 6 depicts an example of a data center. Various embodiments can be used in or with the data center of FIG. 6. As shown in FIG. 6, data center 600 may include an optical fabric 612. Optical fabric 612 may generally include a combination of optical signaling media (such as optical cabling) and optical switching infrastructure via which any particular sled in data center 600 can send signals to (and receive signals from) the other sleds in data center 600. However, optical, wireless, and/or electrical signals can be transmitted using fabric 612. The signaling connectivity that optical fabric 612 provides to any given sled may include connectivity both to other sleds in a same rack and sleds in other racks.

Data center 600 includes four racks 602A to 602D and racks 602A to 602D house respective pairs of sleds 604A-1 and 604A-2, 604B-1 and 604B-2, 604C-1 and 604C-2, and 604D-1 and 604D-2. Thus, in this example, data center 600 includes a total of eight sleds. Optical fabric 612 can provide sled signaling connectivity with one or more of the seven other sleds. For example, via optical fabric 612, sled 604A-1 in rack 602A may possess signaling connectivity with sled 604A-2 in rack 602A, as well as the six other sleds 604B-1, 604B-2, 604C-1, 604C-2, 604D-1, and 604D-2 that are distributed among the other racks 602B, 602C, and 602D of data center 600. The embodiments are not limited to this example. For example, fabric 612 can provide optical and/or electrical signaling.

FIG. 7 depicts an environment 700 that includes multiple computing racks 702, each including a Top of Rack (ToR) switch 704, a pod manager 706, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 708, and INTEL® ATOM™ pooled compute drawer 710, a pooled storage drawer 712, a pooled memory drawer 714, and a pooled I/O drawer 716. Each of the pooled system drawers is connected to ToR switch 704 via a high-speed link 718, such as a 40 Gigabit/second (Gb/s) or 100 Gb/s Ethernet link or an 100+Gb/s Silicon Photonics (SiPh) optical link. In one embodiment high-speed link 718 comprises an 1000 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 700 may be interconnected via their ToR switches 704 (e.g., to a pod-level switch or data center switch), as illustrated by connections to a network 720. In some embodiments, groups of computing racks 702 are managed as separate pods via pod manager(s) 706. In one embodiment, a single pod manager is used to manage all of the racks in the pod. Alternatively, distributed pod managers may be used for pod management operations. RSD environment 700 further includes a management interface 722 that is used to manage various aspects of the RSD environment. This includes managing rack configuration, with corresponding parameters stored as rack configuration data 724.

Any of the systems, data centers or racks discussed above, apart from being integrated in a typical data center, can also be implemented in other environments such as within a bay station, or other micro-data center, e.g., at the edge of a network.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds, and other design or performance constraints, as desired for a given implementation.

Some examples may be implemented using or as an article of manufacture or at least one computer-readable medium. A computer-readable medium may include a non-transitory storage medium to store program code. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the program code implements various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device, or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled, and/or interpreted programming language.

To the extent any of the teachings above can be embodied in a semiconductor chip, a description of a circuit design of the semiconductor chip for eventual targeting toward a semiconductor manufacturing process can take the form of various formats such as a (e.g., VHDL or Verilog) register transfer level (RTL) circuit description, a gate level circuit description, a transistor level circuit description or mask description or various combinations thereof. Such circuit descriptions, sometimes referred to as "IP Cores", are commonly embodied on one or more computer readable storage media (such as one or more CD-ROMs or other type of storage technology) and provided to and/or otherwise processed by and/or for a circuit design synthesis tool and/or mask generation tool. Such circuit descriptions may also be embedded with program code to be processed by a computer that implements the circuit design synthesis tool and/or mask generation tool.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences may also be performed according to alternative embodiments. Furthermore, additional sequences may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An apparatus, comprising:
a cooling assembly comprising i), ii), iii), iv), v), and vi) below:
  i) a cooling mass;
  ii) a first heat spreader;
  iii) a second heat spreader;
  iv) a spring element to be coupled to the first and the second heat spreaders;
  v) a hinge component to form a hinge that the first and the second heat spreaders rotate about, the spring element to apply a force to the first and the second heat spreaders that causes the first and the second heat spreaders to rotate about the hinge toward a circuit board located between the first and the second heat spreaders wherein a first end of the first heat spreader comprises an angled support arm that couples to the cooling mass and a first end of the second heat spreader also comprises an angled support arm that couples to the cooling mass; and
  vi) a wedge element, the wedge element to be inserted between the first and the second heat spreaders to induce rotation of the first and the second heat spreaders toward the circuit board.

2. The apparatus of claim 1 wherein the cooling mass comprises a heat sink.

3. The apparatus of claim 1 wherein the cooling mass comprises at least one of a) and b) below:
  a) a liquid cooling cold plate;
  b) a vapor chamber.

4. The apparatus of claim 1 wherein the circuit board is a dual in-line memory module (DIMM) circuit board.

5. The apparatus of claim 1 wherein the wedge element is integrated with the cooling mass.

6. The apparatus of claim 1 wherein the spring element comprises a U clip.

7. An apparatus, comprising:
a pluggable module, the pluggable module comprising a circuit board, the circuit board comprising a first side having a first semiconductor chip package and a second, opposite side having a second semiconductor chip package, the pluggable module comprising a connector, the connector connecting the pluggable module into a system;
a cooling assembly comprising i), ii), iii), iv), v), and vi) below:
  i) a cooling mass;
  ii) a first heat spreader that is thermally coupled to the first semiconductor chip package on a first side of the circuit board;
  iii) a second heat spreader that is thermally coupled to the second semiconductor chip package on a second side of the circuit board that is opposite the first side;
  iv) a spring element coupled to the first and the second heat spreaders;
  v) a hinge, the first heat spreader pressed against the first semiconductor chip package and the second heat spreader pressed against the second semiconductor chip package in response to rotational forces about the hinge induced by the spring element wherein a first end of the first heat spreader comprises an angled support arm that couples to the cooling mass and a first end of the second heat spreader also comprises an angled support arm that couples to the cooling mass; and
  vi) a wedge element, the wedge element to be inserted between the first and the second heat spreaders to induce rotation of the first and the second heat spreaders toward the circuit board.

8. The apparatus of claim 7 wherein the pluggable module is a dual in-line memory module (DIMM).

9. The apparatus of claim 7 wherein the cooling mass comprises a heat sink.

10. The apparatus of claim 7 wherein the cooling mass comprises one of a) and b) below:
  a) a liquid cooling cold plate;
  b) a vapor chamber.

11. The apparatus of claim 7 wherein the cooling mass is mounted directly to the first and the second heat spreaders.

12. The apparatus of claim 7 wherein the spring element comprises one or more U clips.

13. An apparatus, comprising:
a wedge element;
a first heat spreader to be placed in thermal contact with a semiconductor chip package on a first side of a circuit board, the first heat spreader comprising a first hinge component; and,
a second heat spreader to be placed in thermal contact with a second semiconductor chip package on a second, opposite side of the circuit board, the second heat spreader comprising a second hinge component, the first and second hinge components to form a hinge, the first and the second heat spreaders to rotate about the hinge toward the circuit board in response to the wedge element being inserted between the first and the second heat spreaders.

14. The apparatus of claim 13 also including a cooling mass wherein the cooling mass comprises a heat sink.

15. The apparatus of claim 13 also including a cooling mass wherein the cooling mass comprises one of a) and b) below:

a) a liquid cooling cold plate;

b) a vapor chamber.

16. The apparatus of claim 13 wherein the circuit board is a dual in-line memory (DIMM) circuit board.

17. The apparatus of claim 13 wherein the apparatus further comprises a spring element, the spring element to be coupled to both the first and the second heat spreaders to induce rotation of the heat spreaders about the hinge toward the circuit board.

18. The apparatus of claim 17 wherein the spring element comprises a U clip.

* * * * *